United States Patent [19]

Seki et al.

[11] 4,414,514
[45] Nov. 8, 1983

[54] TWO SIGNAL AMPLIFYING SYSTEM

[75] Inventors: Kunio Seki, Hinode; Ritsuji Takeshita, Hino, both of Japan

[73] Assignee: Hitachi, Ltd., Tokyo, Japan

[21] Appl. No.: 236,502

[22] Filed: Feb. 20, 1981

[30] Foreign Application Priority Data

Feb. 20, 1980 [JP]  Japan ............................ 55-19006

[51] Int. Cl.$^3$ ............................................. H03F 3/26
[52] U.S. Cl. .................................... 330/262; 330/307; 330/207 P
[58] Field of Search ............... 330/262, 207, 273, 298, 330/307

[56] References Cited

FOREIGN PATENT DOCUMENTS 46-27403  8/1971  Japan ................................. 330/262
52-6448   1/1977  Japan ................................. 330/298

Primary Examiner—James B. Mullins
Assistant Examiner—Gene Wan
Attorney, Agent, or Firm—Antonelli, Terry & Wands

[57]  ABSTRACT

A two signal amplifying system is constructed of first and second BTL amplifiers each including a phase splitter and first and second push-pull output circuits. In each of the first and second push-pull output circuits, output transistors are connected between a power source and output terminals, and detectors for detecting the operating states of said transistors are connected with the output transistors constituting the aforementioned first and second push-pull output circuits, respectively. The outputs of those two detectors are fed to a control circuit. The output of the control circuit renders the two output transistors nonconductive in case at least one of the two output transistors deviates from a predetermined operating range.

8 Claims, 3 Drawing Figures

TWO SIGNAL AMPLIFYING SYSTEM

BACKGROUND OF THE INVENTION

The present invention relates to a stereophonic amplifying system constructed of a BTL(Bridged Transformer Less) amplifier including a B-class push-pull output circuit, and more particularly, to a two signal amplifying system such as a stereophonic amplifying system constructed of a one- or two-chip type monolithic IC (semi-conductor integrated circuit).

An ASO (area of safe operation) limiter is typically utilized in the art as the protecting circuit for the output transistor in an amplifying system including a B-class push-pull output circuit. That protecting circuit detects the operating state of the output transistors of the amplifier thereby to render conductive the limiter transistor, which is connected between the input and output of the output transistors, so that the operation of the output transistors may be limited. However, we have found that these output transistors have a drawback in that they oscillate because they have an undesired high-frequency positive feedback loop between their inputs and outputs.

Moreover, we have found that a stereophonic amplifying system including a BTL amplifier has further problems in that the construction of the protecting circuit becomes complex if the aforementioned ASO limiter is provided for all the output transistors (of 4 pieces×2) constituting the BTL amplifier. In this regard, an ASO limiter is typically provided for each output transistor in order to prevent the output transistors from being destroyed in case a short-circuiting accident takes place between the two output terminals due to mistaken wiring, insufficient insulation or the like of the speaker connections because the output circuit has an OCL (Output Condenser Less) construction.

On the other hand, by arranging the ASO limiter for those output transistors which are connected between the power source $V_{CC}$ and the amplifier output OUT at the power source side, which constitues a single power source type B-class push-pull output circuit, those output transistors are rendered nonconductive for any load or ground shorting so that the output transistors at the ground potential side are supplied with no voltage and current and can be indirectly protected. According to our investigations, however, it has been found that the output voltage and current of one channel are fed, when this channel accidentally shorts, through the output terminals to the other channel so that there is a fear of the output transistors of the other channel being destroyed.

SUMMARY OF THE INVENTION

It is therefore an object of the present invention to provide a two-signal amplifying system, such as a stereophonic amplifier, for ensuring the required protection for the amplifier transistors with the use of a simple circuit. According to a preferred embodiment of the present invention, it is possible to provide a stereophonic amplifier which permits a reduction in the external terminals when it is to be monolithically integrated.

The two-signal amplifying system according to the present invention is constructed of two BTL amplifiers each including a single power source type B-class push-pull output circuit. There are disposed in the two-signal amplifying system two detectors for detecting the operating states of the outut transistors of the B-class push-pull output circuit of each of the two BTL amplifiers. Those two detectors render nonconductive the aforementioned two output transistors, which constitute the two signal amplifying system, in response to the detection of an output which is indicative of the fact that the output transistors of the B-class push-pull output circuit have deviated from a predetermined operating range and such detection occurs with respect to the operation of each of the two output transistors.

DESCRIPTION OF THE PREFERRED EMBODIMENT

The present invention will be described in detail in the following in connection with various embodiments thereof.

Figure 1:
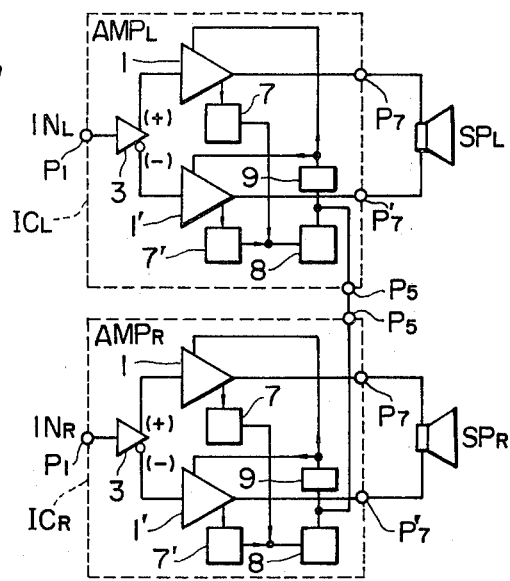
FIG. 1 is a block diagram showing a two signal amplifying system according to one embodiment of the present invention.

In FIG. 1, which is a block diagram showing a two signal amplifying system according to one embodiment of the present invention, first and second input signals $IN_L$ and $IN_R$, i.e., stereophonic left and right signals, are fed to the input terminal $P_1$ of a first BTL amplifier $AMP_L$ and the input terminal $P_1$ of a second BTL amplifier $AMP_R$, respectively. The circuit construction of the first BTL amplifier $AMP_L$ is the same as that of the second BTL amplifier $AMP_R$. The first BTL amplifier $AMP_L$ includes a phase splitter 3 responding to the first input signal $IN_L$ for feeding out the non-inverting and inverting output signals (+) and (−) which are in phase with and in opposite phase to the first input signal, respectively. The noninverting output signal (+) is amplified by the first push-pull output circuit 1 of the first BTL amplifier $AMP_L$ and is fed to a first output terminal $P_7$, whereas the aforementioned inverting output signal (−) is amplified by the second push-pull output circuit 1' of the first BTL amplifier $AMP_L$ and is fed to a second output terminal $P_7$. On the other hand, the second BTL amplifier $AMP_R$ also includes a phase splitter 3 responding to the second input signal $IN_R$ for feeding out the noninverting and inverting output signals (+) and (−) which are in phase with and in opposite phase to the second input signal, respectively. The noninverting output signal (+) is amplified by the first push-pull output circuit 1 of the second BTL amplifier $AMP_R$ and is fed to a first output terminal $P_7$, whereas the aforementioned inverting output signal (−) is amplified by the second push-pull output circuit 1' of the aforementioned second BTL amplifier $AMP_R$ and is fed to a second output terminal $P_7'$.

Figure 2:
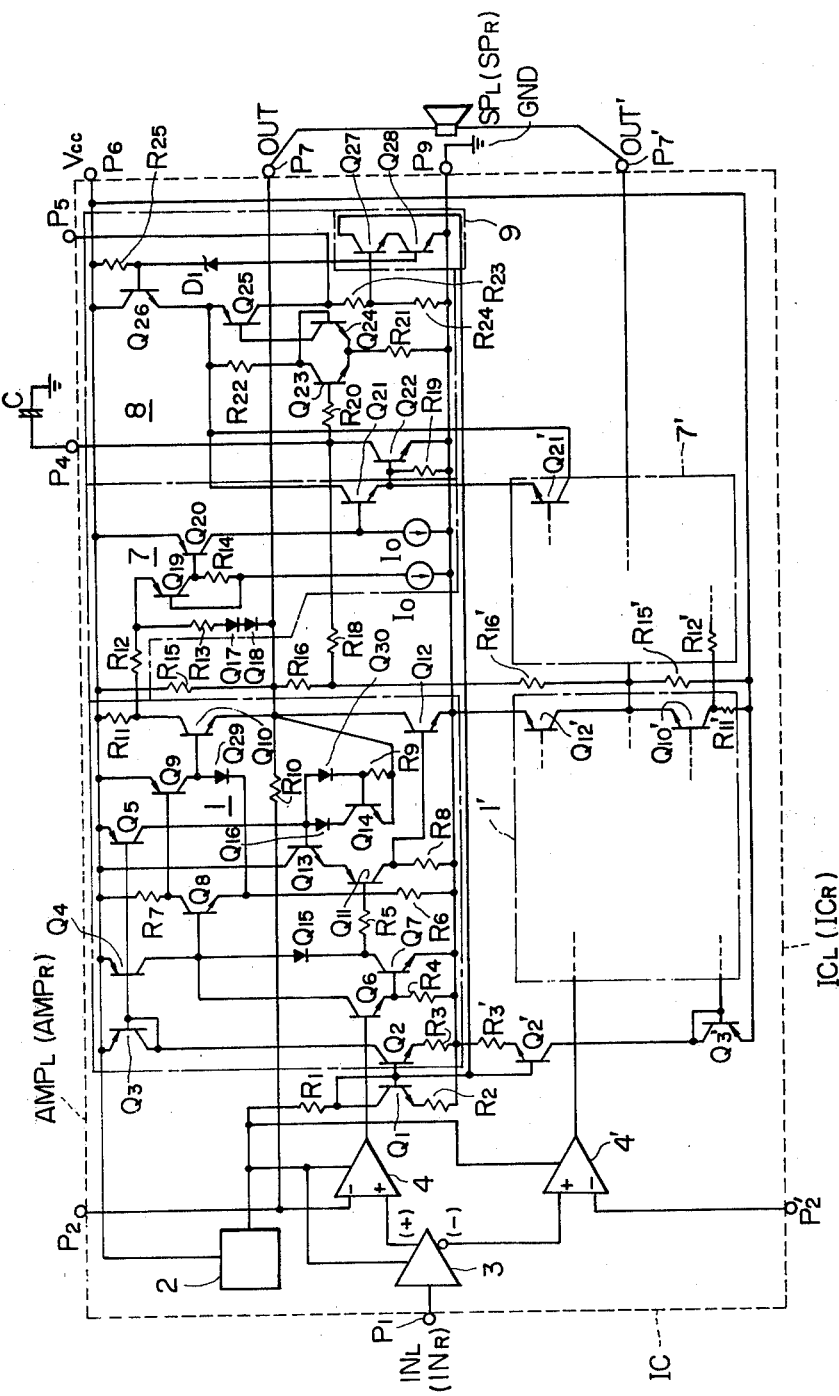
FIG. 2 is a circuit diagram showing a BTL amplifier which constitutes the two signal amplifying system shown in FIG. 1 for amplifying one channel.

The first push-pull output circuit 1 of each of the first and second BTL amplifiers $AMP_L$ and $AMP_R$ is equipped, as shown in FIG. 2, with both an output transistor $Q_{10}$, which is connected between a power source $V_{CC}$ and the first output terminal $P_7$, and the other output transistor $Q_{12}$ which is connected between the first output terminal $P_7$ and a ground point GND via terminal $P_9$. The second push-pull output circuit 1' of each of the first and second BTL amplifiers $AMP_L$ and AMP$_R$ is likewise equipped, as shown in FIG. 2, with both an output transistor Q$_{10}$', which is connected between the power source V$_{CC}$ and the second output terminal P$_7$', and the other output transistor Q$_{12}$' which is connected between the second output terminal P$_7$' and the ground point GND.

With each of the output transistors Q$_{10}$ of the first push-pull output circuits 1 of the first and second BTL amplifiers AMP$_L$ and AMP$_R$, there is connected a first detector 7 for detecting the operating states of those transistors. With each of the output transistors Q$_{10}$' of the second push-pull output circuits 1' of the first and second BTL amplifiers AMP$_L$ and AMP$_R$, there is likewise connected a second detector 7' for detecting the operating states of those transistors.

In either the first BTL amplifier AMP$_L$ or the second BTL amplifier AMP$_R$, the output of the first detector 7 and the output of the second detector 7' are connected with the input of a retention circuit 8. The output of the retention circuit 8 of the first BTL amplifier AMP$_L$ is applied to the external terminal P$_5$ of a first semiconductor integrated circuit IC$_L$; whereas, the output of the retention circuit 8 of the second BTL amplifier AMP$_R$ is applied to the external terminal P$_5$ of a second semiconductor integrated circuit IC$_R$. The external terminal P$_5$ of the first semiconductor integrated circuit IC$_L$ and the external terminal of the second semiconductor integrated circuit IC$_R$ are electrically connected outside of those integrated circuits.

In either the first BTL amplifier AMP$_L$ or the second BTL amplifier AMP$_R$, the output of the retention circuit 8 is connected with the input of a control circuit 9. Since this control circuit 9 is made to respond to the output signals of the first and second detectors 7 and 7' of each of the first and second BTL amplifiers AMP$_L$ and AMP$_R$, all of the output transistors Q$_{10}$ and Q$_{10}$' of the first and second push-pull output circuits 1 and 1' of the first and second BTL amplifiers AMP$_L$ and AMP$_R$ are controlled into their nonconductive states in case at least one of the output transistors Q$_{10}$ or Q$_{10}$' deviates from a predetermined operating region.

The aforementioned deviations of the output transistors Q$_{10}$ and Q$_{10}$' from the predetermined operating region result not only from the short-circuiting between both the terminals of the speaker load SP$_L$ or SP$_R$, which is connected between the output terminals P$_7$ and P$_7$' of the first and second push-pull output circuits 1 and 1' in the first or second BTL amplifier AMP$_L$ or AMP$_R$, but also from ground shorting (e.g., short-circuiting with the ground point GND) of either the aforementioned first or second output terminal P$_7$ or P$_7$' or short-circuiting with the other channel.

The control circuit 9 controls the output transistors into their nonconductive states in the aforementioned manner in case at least one of the output transistors Q$_{10}$ or Q$_{10}$' deviates from a predetermined operating range due to the abnormal condition of the load of at least one of the first or second output terminals P$_7$ or P$_7$' of the first or second BTL amplifiers AMP$_L$ or AMP$_R$. The aforementioned retention circuit 8 is of an automatic return type so that it controls the input to the control circuit 9 in a manner to interrupt the nonconduction of the output transistors when the abnormal condition of the aforementioned load state is eliminate.

FIG. 2 is a circuit diagram showing the circuit construction of the first or second BTL amplifier AMP$_L$ or AMP$_R$, each having an identical circuit construction.

The circuit defined by broken lines IC$_L$ (or IC$_R$) is constructed as a semiconductor integrated circuit.

The phase splitter 3 is constructed of a differential amplifier for generating the aforementioned signals (+) and (−) in opposite phase in response to the input signal IN$_L$ (or IN$_R$) fed from the external terminal P$_1$ of the IC so that it may be amplified. The noninverting output signal (+) of the phase splitter 3 is impressed upon a preamplifier 4, the output of which is applied to an A-class voltage amplifier constructed of transistors Q$_6$ and Q$_7$ connected in the Darlington mode and a constant current load transistor Q$_4$ connected with the collectors of those transistors. The output signal from the collector of the aforementioned amplifying transistor Q$_7$ is impressed upon the base of pnp transistor Q$_{11}$, which operates to drive the output transistor Q$_{12}$ for generating a negative half-wave output of the B-class push-pull output circuit through a resistor R$_5$ for preventing oscillations. The aforementioned half-wave output can be generated by driving the aforementioned output transistor with the collector output signal of that drive transistor Q$_{11}$.

The emitter of the aforementioned drive transistor Q$_{11}$ is connected to receive the voltage at the output terminal P$_7$ by way of both the emitter and base of a transistor Q$_{13}$ and a constant voltage circuit which is constructed of a transistor Q$_{14}$, a resistor R$_9$ connected between the base and emitter of that transistor, and diodes (which include transistors connected as diodes) Q$_{16}$ and Q$_{30}$ connected between the base and collector of that transistor. On the other hand, the collector output signal of the aforementioned amplifying transistor Q$_7$ is impressed through a biasing diode Q$_{15}$ and a transistor Q$_8$ upon the base of a pnp transistor Q$_9$ which operates to drive the output transistor Q$_{10}$ for generating the positive half-wave output of the B-class push-pull output circuit. The collector output signal of the transistor Q$_7$ is inverted once by the transistor Q$_8$ and then by the drive transistor Q$_9$ so that the aforementioned positive half-wave output can be generated by the output transistor Q$_{10}$.

The reason why a pnp transistor is used as the drive transistor Q$_9$ for driving the output transistor Q$_{10}$ for generating the aforementioned positive half-wave output is to effect symmetry with the negative side circuit and to reduce the remaining positive side voltage to a level (V$_{BEQ10}$+V$_{CEsatQ9}$). On the other hand, resistors R$_6$ and R$_7$ are connected with the emitter and collector of the phase inverting transistor Q$_8$ which is disposed at the front stage of the aforementioned drive transistor Q$_9$, and a level shifting diode Q$_{29}$ is connected between the emitter of that transistor and the base of the output transistor Q$_{10}$. The aforementioned constant voltage circuit and the transistor Q$_{13}$ are supplied with a bias current from a constant current transistor Q$_5$. For the input signal IN$_L$ (or IN$_R$), consequently, an output signal OUT in phase therewith is generated from the first output terminal P$_7$.

The inverting output (−) of the aforementioned phase splitter 3 generates an output signal OUT' in opposite phase from the output terminal P$_7$' in response to the input signal with the use of the preamplifier 4' similar to the aforementioned preamplifier 4, the A-class voltage amplifier and the B-class push-pull output circuit 1', thus constituting a BTL amplifier, in which the speaker load SP$_L$ (or SP$_R$) is connected between the aforementioned first and second output terminals P$_7$ and P$_7$'.

The external terminals $P_2$ and $P_2'$, which are connected with the inverting input (−) of the aforementioned preamplifiers 4 and 4', are used to provide a negative feedback circuit (although not shown) for setting an AC gain between the first and second output terminals $P_7$ and $P_7'$.

On the other hand, a stabilizing power source circuit 2 is provided which constitutes a constant voltage source circuit having a high power source ripple eliminating coefficient with the use of a constant voltage element, such a Zener diode, thereby to feed the phase splitter 3 and the preamplifiers 4 and 4' with the constant voltage. This constant voltage is also fed to the constant voltage generating circuit which is constructed of a resistor $R_1$ and a diode-connected transistor $Q_1$. The constant voltage, which is generated at the base of the aforementioned transistor $Q_1$, is impressed upon the bases of transistors $Q_2$ and $Q_2'$ thereby to generate a constant current as is predetermined by the ratio among resistors $R_2$, $R_3$ and $R_3'$ connected with the emitters of the respective transistors, by the emitter area ratio and the like, and the constant current thus generated flows through transistors $Q_3$ and $Q_3'$ which constitute a current mirror circuit together with the aforementioned constant current transistors $Q_4$ and $Q_5$.

In the embodiment being described, the following circuit is used as the ASO type protecting circuit for the BTL amplifier having the construction thus-far described.

With the collector of the transistor $Q_{10}$ for generating the positive half-wave output, there is connected the detector 7 for detecting the operating state of that transistor $Q_{10}$. That detector 7 is equipped with a resistor $R_{11}$ for detecting the collector current and with voltage dividing resistors $R_{12}$ and $R_{13}$ connected between the collector and emitter of that transistor $Q_{10}$ for detecting the collector-emitter voltage. The aforementioned resistors $R_{11}$, $R_{12}$ and $R_{13}$ detect the current and voltage of the output transistor $Q_{10}$ so that the detected output is impressed upon the emitter of a pnp transistor $Q_{19}$. The collector of that transistor $Q_{19}$ is connected to a resistor $R_{14}$ and a constant current circuit $I_0$ and is connected with the base of a transistor $Q_{20}$. Moreover, the power source voltage $V_{CC}$ is impressed upon the emitter of the transistor $Q_{20}$, from the collector of which the ASO detected output is generated.

In the ASO type detector 7 thus constructed, if the values of the resistors $R_{11}$ and $R_{13}$ are preset to have a relationship of $R_{11} \ll R_{13}$, the voltage $V_{BEQ20}$ to be applied between the base and emitter of the transistor $Q_{20}$ can be calculated by the following Equation (1):

$$V_{BEQ20} = R_{11}I_{CQ10} + \frac{R_{12}}{R_{13}} V_{CEQ10} + I_0(R_{12} - R_{14}) + V_{BEQ19} \quad (1)$$

Here, series diodes $Q_{17}$ and $Q_{18}$ connected in series with the resistor $R_{13}$ are neglected because they are provided for temperature compensation. In the aforementioned detector 7, on the other hand, by taking the transistors $Q_{19}$ and $Q_{20}$ as a pair, it is when $V_{BEQ20} - V_{BEQ19} > 0$ that the transistor $Q_{21}$ of the detector 7 becomes conductive. Therefore, the ASO detection level can be deduced from the following Inequality (2):

$$R_{11}I_{CQ10} + \frac{R_{12}}{R_{13}} V_{CEQ10} + I_0(R_{12} - R_{14}) > 0 \quad (2)$$

The Inequality (2) can be transformed into the following Inequality (3):

$$I_{CQ10} > \frac{R_{14} - R_{12}}{R_{11}} I_0 - \frac{R_{12}}{R_{11}R_{13}} V_{CEQ10} \quad (3)$$

On the other hand, if the relationships of $$I_0 = \frac{V_{CC}}{R_{13}}$$

and $R_{14} = 2R_{12}$ are set, the Inequality (3) can be simplified into the following Inequality (4):

$$I_{CQ10} > \frac{R_{12}}{R_{11}R_{13}} (V_{CC} - V_{CEQ10}) \quad (4)$$

As has been described hereinbefore, the ASO type detector 7 of the embodiment under consideration can effect the highly-accurate ASO detection required because the ASO detection level can be preset only by the resistance ratio among the resistors $R_{11}$, $R_{12}$ and $R_{13}$ independently of the base-emitter voltage $V_{BE}$ of the detecting transistors $Q_{19}$ and $Q_{20}$. Moreover, since a highly-accurate resistance ratio can be attained in the monolithic IC, it can be said that the embodiment is suitable for monolithic circuit integration.

As is apparent from the Inequality (4), the ASO detection output, at which the transistor $Q_{21}$ is turned on, is generated when the relationship between the collector current $I_{CQ10}$ of the output transistor $Q_{10}$ and the collector-emitter voltage $V_{CEQ10}$ exceeds the straight line joining the point 0(V), $$\frac{R_{12}}{R_{11}R_{13}} V_{CC}(A)$$

and the point $V_{CC}(V)$, 0(A).

As to the operating locus of the output transistor $Q_{10}$ in its steady operation, on the other hand, even if the linearity of the current amplification factor is infinite and if the saturation current is zero, the collector current and the collector-emitter voltage for a load resistance $R_L$ in the case of a BTL amplifier of the OCL type never exceed theoretically the straight line joining the joint 0(V), $V_{CC}/R_L(A)$ and the point $V_{CC}(V)$, 0(A). Therefore, if the minimum of the load resistance $R_L$ is denoted at $R_{Lmin}$, the erroneous operation that the ASO detection output is generated in the steady operation ($R_L > R_{Lmin}$) is not caused if the design is made to satisfy the relationship of $$\frac{R_{12}}{R_{11}R_{13}} > \frac{1}{R_{Lmin}}.$$

The ASO detector 7' similar to the aforementioned detector 7 is disposed in the B-class push-pull output circuit 1' which operates to generate the other output $OUT_2$. Moreover, the collector detection output of the transistor $Q_{20}$ is impressed upon the transistors $Q_{21}$ and $Q_{21}'$ having their collectors and emitters connected in common so that the discharge of a condenser C, which is connected through an external terminal $P_4$, is controlled by the transistor $Q_{22}$ of the retention circuit 8, which is connected in the Darlington mode with either of those transistors $Q_{21}$ and $Q_{21}'$.

The retention circuit 8 is constructed by connecting high resistors $R_{15}$ and $R_{15}'$ between the first and second output terminals $P_7$ and $P_7'$ and the power source voltage $V_{CC}$, by connecting the first and second output terminals $P_7$ and $P_7'$ with high resistors $R_{16}$ and $R_{16}'$ and by feeding a charging current to the condenser C through a high resistor $R_{18}$.

The charging voltage of the condenser C of that retention circuit 8 is impressed upon the one transistor $Q_{23}$ of the differential transistors $Q_{23}$ and $Q_{24}$ which have their common emitter connected with a resistor $R_{21}$. The collector of the one transistor $Q_{23}$ is connected both to the base of the other transistor $Q_{24}$ and to a load resistor $R_{22}$, and the collector of the other transistor $Q_{24}$ is connected with an output transistor $Q_{25}$, thereby to constitute a Schmidt trigger circuit.

The output of the aforementioned Schmidt trigger circuit is divided by resistors $R_{23}$ and $R_{24}$ so that the divided voltage is impressed upon the transistor $Q_{27}$ of the control circuit 9, which operates to render nonconductive the transistors $Q_1$ and $Q_2$ (or $Q_2'$) for generating the aforementioned constant current. On the other hand, the output of the aforementioned Schmidt trigger circuit is also led from the external terminal $P_5$ to the outside of the monolithic IC.

In the control circuit 9, a transistor $Q_{28}$ is connected in series with the aforementioned transistor $Q_{27}$, and a Zener diode $D_1$ and a resistor $R_{25}$ are connected between the base of that transistor $Q_{28}$ and the power source voltage $V_{CC}$. The aforementioned transistor $Q_{28}$ and Zener diode $D_1$ are used to prohibit the operation of the control circuit 9 because the protecting operation of the output transistor is not required in case the power source voltage $V_{CC}$ is preset at a lower level than the base-emitter voltage $V_{BE}$ of the transistor $Q_{28}$ and the Zener voltage $V_z$. On the other hand, the aforementioned Zener voltage is used to feed a stabilizing voltage to the aforementioned Schmidt trigger circuit through a transistor $Q_{26}$.

In each of the BTL amplifiers thus constructed according to the present invention, in case a current or voltage exceeding the ASO operation level is impressed upon the output transistor $Q_{10}$ or $Q_{10}'$ for generating the positive half-wave output of the output OUT or OUT' (i.e., in case the output transistor $Q_{10}$ or $Q_{10}'$ deviates from its predetermined operating range), the transistor $Q_{22}$ is rendered conductive through the transistor $Q_{21}$ or $Q_{21}'$ so that the condenser C is discharged to invert the Schmidt trigger circuit, by the output of which the transistor $Q_{27}$ is rendered conductive to render nonconductive the transistors $Q_2$ and $Q_2'$ for generating the constant current. As a result, the constant current transistors $Q_4$ and $Q_5$ are rendered nonconductive Since no base current is fed to the transistors $Q_8$, $Q_9$ and $Q_{10}$ of the B-class push-pull output circuit 1 by the nonconduction of the aforementioned transistor $Q_4$, those transistors can be rendered nonconductive. Since, moreover, no base current is fed to the transistors $Q_{11}$ and $Q_{12}$ of the B-class push-pull output circuit 1 by the nonconduction of the aforementioned transistor $Q_5$, those transistors can also be rendered nonconductive. At the same time, the transistors $Q_8$, $Q_9$, $Q_{10}$, $Q_{11}$ and $Q_{12}$ of the B-class push-pull output circuits 1 and 1' of the second BTL amplifier $AMP_R$ are likewise rendered nonconductive.

Since no charging current flows into the condenser C while the ground shorting continues in case the requirement for effecting the aforementioned ASO protecting operation is caused by the ground shortings at the output terminals $P_7$ and $P_7'$, the Schmidt trigger circuit is left inverted so that the bias current of the output circuit 1 is still interrupted by the conduction of the aforementioned transistor $Q_{27}$ thereby to continue the protecting operation.

When the ground shorting condition is released, the condenser C is charged through the resistors $R_{15}$, $R_{15}'$, $R_{16}$ and $R_{16}'$. If the voltage for returning the Schmidt trigger circuit is reached, the transistor $Q_{27}$ is rendered nonconductive to feed again the bias current of the output circuit 1 so that the amplification is automatically started.

For the short-circuiting or the like at the output terminals of the other channel, on the other hand, the external output terminals $P_5$ of the retention circuits 8 of the aforementioned respective BTL amplifiers $IC_L$ and $IC_R$ of the stereophonic amplifying system constructed of the similar BTL amplifiers $IC_L$ and $IC_R$ are connected, as shown in FIG. 1. As a result, in case a short-circuiting accident takes place between the output terminals with the aforementioned other channel, this accident is detected by either of the ASO detectors 7 and 7' thereby to invert the retention circuit 8, the outputs of which operate the transistors for blocking the biasing current of the other BTL amplifier, thus rendering all of the output transistors nonconductive. Thus, the protecting operation can be performed even for the short-circuiting between the outputs of the other channel.

In the case of the short-circuiting between the outputs of the one channel and the other channel, the output terminals $P_7$ and $P_7'$ of the BTL amplifiers $IC_L$ and $IC_R$ do not take the ground level. As a result, the condenser C is charged through the aforementioned resistors $R_{16}$, $R_{16}'$ and $R_{18}$ so that the Schmidt trigger circuit automatically restores its operation. If, at this time, the aforementioned inter-output short-circuiting is continued, the operations of discharging the condenser C, inverting the Schmidt trigger circuit and blocking the biasing current are repeated at the time when the ASO detection level is exceeded. As a result, in case the aforementioned short-circuiting operations are intermittent, the intermittent amplifying operations are repeated in accordance with the hysteresis voltage of the Schmidt trigger circuit and with the time constant present by the condenser C, the resistor $R_{18}$ and so on.

The intermittent operations of that stereophonic amplifying system and the interruptions of the outputs of the two channels can be used as an indication of the abnormal condition of the stereophonic amplifying system thereby to remind the user to check condition of the wiring and area useful for ensuring the operations of the stereophonic amplifying system under the best condition.

In contrast to the case in which the ASO limiters are attached to all of the output transistors, in accordance with this invention, the ASO detectors are attached to only the output transistors for generating the positive half-wave outputs in accordance with the present invention so that the protecting circuit for controlling the biasing currents may be made common thereby to simplify the construction of the circuit and to effect the protecting operations through the interruption of the biasing currents. As a result, no oscillation takes place to dispense with the preventing circuit therefor.

According to the present invention, moreover, the ASO detectors may also be connected with the output transistors for generating the negative half-wave outputs. Still moreover, in case the stereophonic amplifying system is constructed of an IC having two chips, it is sufficient to merely add one external terminal for feeding out the ASO detection output. As a result, it becomes possible to minimize the number of the external terminals to be added and to ensure the protecting operations for all the short-circuiting accidents of the output terminals.

Figure 3:
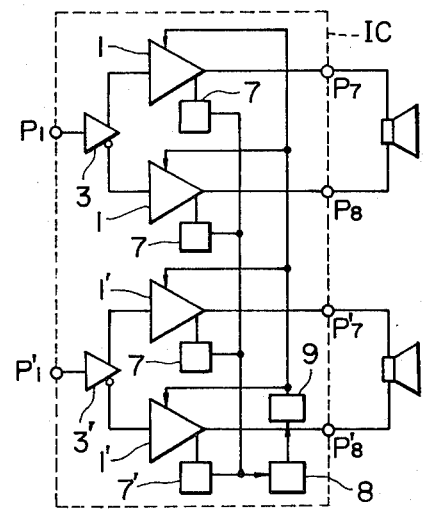
FIG. 3 is a block diagram showing a two signal amplifying system according to another embodiment of the present invention.

The present invention should not be limited to the embodiment thus-far described but can be so modified that it is constructed of two BTL amplifiers having a one chip IC, as shown in FIG. 3. In this modification, the retention circuit 8 constructed of the Schmidit trigger circuit or the like is shared between the aforementioned two BTL amplifiers thereby to prevent the number of the external terminals from being increased and to simplify the circuit construction, as desired.

In an alternative, a latch circuit may be operated by the ASO detection output thereby to control the biasing current. In this modification, although the condenser C, the leak resistor and the like can be dispensed with, it is necessary that the circuit can be returned by interrupting the power source in order to release the protecting operation.

In the present invention, the specific circuit constructions of the power amplifier, which is composed of the preamplifier constituting the BTL amplifiers, the A-class voltage amplifier and B-class push-pull amplifier, can be modified in various manners. Still moreover, the ASO detectors may be of any type including that which is constructed of such a simple circuit as uses the base-emitter voltage of the transistor as the ASO detection level.

Thus, the present invention can be widely utilized as a stereophonic amplifier which is constructed of the BTL amplifiers.

What is claimed is:

1. A two signal amplifying system comprising:
   a first BTL amplifier for amplifying a first input signal and a second BTL amplifier for amplifying a second input signal; each of said first and second BTL amplifiers including a first push-pull output circuit for delivering a noninverting output signal, and a second push-pull output circuit for delivering an inverting output signal;
   a first speaker load connected between an output terminal of the first push-pull output circuit and an output terminal of the second push-pull output circuit of said BTL amplifier;
   a second speaker load connected between an output terminal of the first push-pull output circuit and an output terminal of the second push-pull output circuit of said second BTL amplifier;
   a power source;
   said first push-pull output circuit of each of said first and second BTL amplifiers including a first output transistor connected between said power source and the output terminal thereof;
   said second push-pull output circuit of each of the first and second BTL amplifiers including a second output transistor connected between said power source and the output terminal thereof;
   first and second detectors connected with the first and second output transistors, respectively, for detecting the respective operating states of said transistors;
   a control circuit having its input connected to receive the outputs of the first and second detectors of each of the first and second BTL amplifiers for rendering nonconductive both of the first and second output transistors of both the first and second BTL amplifiers in case at least one of said first or second output transistors of either of said first or second BTL amplifiers deviates from a predetermined operating range.

2. A two signal amplifying system as set forth in claim 1, wherein said first and second input signals are stereophonic left and right signals.

3. A two signal amplifying system as set forth in claim 2, wherein the outputs of the first and second detectors are fed through a retention circuit to the input of said control circuit.

4. A two signal amplifying system as set forth in claim 3, wherein said first and second BTL amplifiers are formed as first and second semiconductor integrated circuits, respectively, wherein separate retention circuits are provided in the first and second BTL amplifiers, respectively, having outputs connected to external terminals of the respective first and second semiconductor integrated circuits, and wherein said two external terminals are electrically connected together to connect both the inputs of the respective control circuit which are provided in the first and second BTL amplifiers.

5. A two signal amplifying system as set forth in claims 1, 2, 3, or 4, wherein the first and second detectors include means to detect a collector current and a collector emitter voltage of the first and second output transistors, respectively.

6. A two signal amplifying system as set forth in claims 1, 2, 3, or 4, wherein the first push-pull output circuit of each of the first and second BTL amplifiers includes a third output transistor connected between the output terminal thereof and ground, wherein the second push-pull output circuit of each of the first and second BTL amplifiers includes a fourth output transistor connected between the output terminal thereof and ground, and further including means for connecting the output of said control circuit to said third and fourth transistors to render them nonconductive in case at least one of the first or second output transistors of the first or second BTL amplifiers deviates from said predetermined operating range.

7. A two signal amplifying system as set forth in claim 1, 2, 3 or 4, wherein the first push-pull output circuit of each of the first and second BTL amplifiers includes a third output transistor connected between the output terminal thereof and ground, wherein the second push-pull output circuit of each of the first and second BTL amplifiers includes a fourth output transistor connected between the output terminal thereof and ground, and further wherein said first and second detectors are coupled to only detect the operating conditions of said first and second output transistors, respectively, and not the operating conditions of said third and fourth transistors, said system further including means for connecting the output of said control circuit to said third and fourth transistors to render them nonconductive in case at least one of the first or second output transistors of the first or second BTL amplifiers deviates from said predetermined operating range.

8. A two signal amplifying system as set forth in claim 1, further comprising a retention circuit coupled to said outputs of said first and second detectors and to said control circuit, said retention circuit including means for controlling said control circuit to render said first and second output transistors of said first and second BTL amplifiers conductive when said first and second output transistors return to said predetermined operating range following a deviation of at least one of said first or second output transistors from said predetermined operating range.

* * * * *